(12) United States Patent
Ishiguro et al.

(10) Patent No.: US 11,728,642 B2
(45) Date of Patent: Aug. 15, 2023

(54) SEMICONDUCTOR DEVICE AND PROTECTION CIRCUIT

(71) Applicant: Kioxia Corporation, Tokyo (JP)

(72) Inventors: Shigefumi Ishiguro, Yokohama Kanagawa (JP); Yasuhiro Suematsu, Yokohama Kanagawa (JP); Takeshi Miyaba, Yokohama Kanagawa (JP); Kimimasa Imai, Kawasaki Kanagawa (JP); Maya Inagaki, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 143 days.

(21) Appl. No.: 17/474,941

(22) Filed: Sep. 14, 2021

(65) Prior Publication Data
US 2022/0285934 A1 Sep. 8, 2022

(30) Foreign Application Priority Data
Mar. 5, 2021 (JP) .................................. 2021-035519

(51) Int. Cl.
*H02H 9/04* (2006.01)
*H03H 7/01* (2006.01)
*H03K 19/20* (2006.01)

(52) U.S. Cl.
CPC .......... *H02H 9/046* (2013.01); *H03H 7/0115* (2013.01); *H03K 19/20* (2013.01)

(58) Field of Classification Search
CPC ............ H02H 9/046; H02H 7/20; H02H 9/04; H03H 7/0115; H03K 19/20; H01L 27/0285

USPC .......................................................... 361/56
See application file for complete search history.

(56) References Cited

U.S. PATENT DOCUMENTS

| 10,360,982 B2 | 7/2019 | Suematsu et al. |
| 10,482,977 B2 | 11/2019 | Shiraishi et al. |
| 10,622,074 B2* | 4/2020 | Inagaki ............... H01L 27/0266 |
| 2005/0057873 A1* | 3/2005 | Kitagawa ............... H02H 9/046 |
| | | 361/91.1 |
| 2013/0228867 A1 | 9/2013 | Suematsu et al. |
| 2016/0020606 A1* | 1/2016 | Kato ..................... H03K 17/22 |
| | | 361/56 |

(Continued)

FOREIGN PATENT DOCUMENTS

| EP | 3249417 A2 * | 11/2017 | ......... G01R 31/2856 |
| JP | 2019054370 A | 4/2019 | |

*Primary Examiner* — Dharti H Patel
(74) *Attorney, Agent, or Firm* — Holtz, Holtz & Volek PC

(57) ABSTRACT

In one embodiment, a protection circuit in a semiconductor device includes first and second transistors including gates electrically connected to a first node, and connected in series to each other between the first and second lines, third and fourth transistors including gates electrically connected to a second node between the first and second transistors, and connected in series to each other between the first and second lines, and a fifth transistor including a gate electrically connected to a third node between the third and fourth transistors, and provided between the second node and the second line. The protection circuit further includes an arithmetic circuit configured to perform calculation using a first signal received from the second node to output a second signal, and a sixth transistor configured to receive the second signal to output a control signal to the arithmetic circuit.

20 Claims, 10 Drawing Sheets

(56) References Cited

U.S. PATENT DOCUMENTS

| | | | |
|---|---|---|---|
| 2016/0181796 A1* | 6/2016 | Fifield | H01L 23/5228 |
| | | | 361/56 |
| 2018/0082992 A1* | 3/2018 | Mertens | H01L 23/60 |
| 2018/0233205 A1* | 8/2018 | Inagaki | H01L 27/0285 |
| 2021/0057908 A1* | 2/2021 | Franck | H02H 9/046 |
| 2021/0391703 A1* | 12/2021 | Dua | H02H 3/08 |

* cited by examiner

SEMICONDUCTOR DEVICE AND PROTECTION CIRCUIT

CROSS REFERENCE TO RELATED APPLICATION

This application is based upon and claims the benefit of priority from the prior Japanese Patent Application No. 2021-035519, filed on Mar. 5, 2021, the entire contents of which are incorporated herein by reference.

FIELD

Embodiments described herein relate to a semiconductor device and a protection circuit.

BACKGROUND

In a semiconductor device including an electrostatic discharge (ESD) protection circuit that protects a protection target circuit from static electricity, it is desirable that surge charge in the ESD protection circuit be favorably discharged.

DETAILED DESCRIPTION

Embodiments will now be explained with reference to the accompanying drawings. The same reference signs are used to refer to the same components in FIGS. 1 to 10 and redundant description is omitted.

In one embodiment, a semiconductor device includes a protection circuit electrically connected to a first line to be supplied with a first voltage and a second line to be supplied with a second voltage, and a protection target circuit electrically connected to the first line and the second line downstream of the protection circuit, and to be protected by the protection circuit. The protection circuit includes first and second transistors including gates electrically connected to a first node, and connected in series to each other between the first and second lines, third and fourth transistors including gates electrically connected to a second node between the first and second transistors, and connected in series to each other between the first and second lines, and a fifth transistor including a gate electrically connected to a third node between the third and fourth transistors, and provided between the second node and the second line. The protection circuit further includes an arithmetic circuit configured to receive a first signal from the second node or a fourth node located downstream of the second node, and output a second signal obtained by calculation using the first signal, and a sixth transistor electrically connected to a fifth node located downstream of the second node, and configured to receive the second signal from the arithmetic circuit and output a control signal to the arithmetic circuit.

First Embodiment

Figure 1:
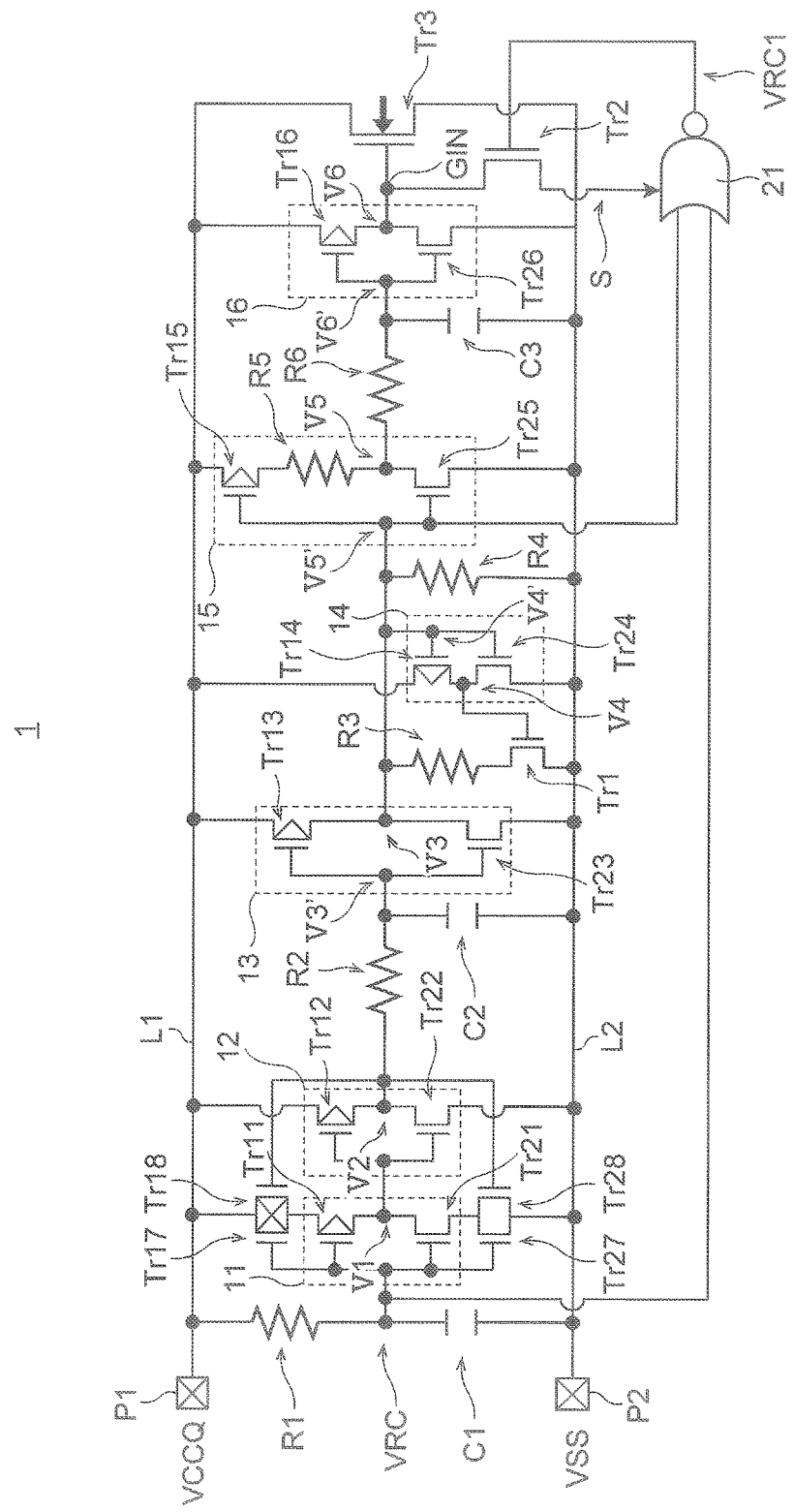
FIG. 1 is a circuit diagram showing a configuration of an ESD protection circuit of a first embodiment.

FIG. 1 is a circuit diagram showing a configuration of an ESD protection circuit 1 of a first embodiment.

The ESD protection circuit 1 of the present embodiment, which is provided in a semiconductor device, can protect a protection target circuit in the semiconductor device from static electricity. The semiconductor device includes, for example, a three-dimensional memory as the protection target circuit. The ESD protection circuit 1 of the present embodiment is an RCTMOS circuit.

The semiconductor device includes pads P1 and P2 and lines L1 and L2, to which a power supply voltage is to be supplied. The pad P1 is an external connection pad to which a VCCQ voltage is to be supplied. The pad P2 is an external connection pad to which a VSS voltage is to be supplied. The line L1 is a power supply line to which the VCCQ voltage is to be supplied from the pad P1. The line L2 is a power supply line to which the VSS voltage is to be supplied from the pad P2. The ESD protection circuit 1 of the present embodiment is electrically connected to the lines L1 and L2 and the protection target circuit of the present embodiment is electrically connected to the lines L1 and L2 downstream of the ESD protection circuit 1. An example of a configuration of the protection target circuit will be described later. The VCCQ voltage is an example of a first voltage and the VSS voltage is an example of a second voltage. The line L1 is an example of a first line and the line L2 is an example of a second line.

A VCC voltage may be supplied to the pad P1 instead of the VCCQ voltage. In this case, the VCC voltage is to be supplied to the line L1 from the pad P1. Any of "VCCQ voltages" referred to hereinbelow can be replaced with a "VCC voltage."

The ESD protection circuit 1 of the present embodiment includes transistors Tr11 and Tr21 that provide an inverter 11, transistors Tr12 and Tr22 that provide an inverter 12, transistors Tr13 and Tr23 that provide an inverter 13, transistors Tr14 and Tr24 that provide an inverter 14, transistors Tr15 and Tr25 that provide an inverter 15, transistors Tr16 and Tr26 that provide an inverter 16, and transistors Tr17, Tr18, Tr27, and Tr28 that are adjacent to the inverter 11. The transistors Tr13, Tr23, Tr14, Tr24, Tr15, Tr25, Tr16, and Tr26 are examples of first, second, third, fourth, seventh, eighth, ninth, and tenth transistors, respectively.

The ESD protection circuit 1 of the present embodiment also includes other transistors Tr1, Tr2, and Tr3 and resistances R1, R2, R3, R4, R5, and R6, capacitors C1, C2, and C3, and a NOR circuit (NOR gate) 21. The transistors Tr1, Tr2, and Tr3 are examples of fifth, sixth, and eleventh transistors, respectively. The NOR circuit 21 is an example of an arithmetic circuit.

FIG. 1 also shows a node VRC, a node V1, node V2, a node V3', a node V3, a node V4', a node V4, a node V5', a node V5, a node V6', a node V6, and a node GIN in the ESD protection circuit 1. The node V3' is an example of a first node, the nodes V3, V4', and V5' are examples of a second node, and the node V4 is an example of a third node. The nodes V5 and V6' are examples of a fourth node, the node V6 and GIN are examples of a fifth node, and the node VRC is an example of a sixth node. Reference signs denoting the nodes are also used as reference signs denoting voltages on the nodes. For example, a voltage on the node V1 is also written as a voltage V1.

The resistance R1 and the capacitor C1 are connected in series to each other between the line L1 and the line L2. The resistance R1 is located between the line L1 and the node VRC. The capacitor C1 is located between the node VRC and the line L2. The resistance R1 and the capacitor C1 function as a trigger circuit that operates on the basis of a time constant determined by a resistance value of the resistance R1 and a capacitance value of the capacitor C1. A voltage VRC follows a variation in the VCCQ voltage of the pad P1 with a temporal delay based on the time constant. The trigger circuit is also referred to as an RC timer.

A gate of the transistor Tr11 and a gate of the transistor Tr21 are electrically connected to the node VRC. The transistor Tr11 and the transistor Tr21 are connected in series to each other between the line L1 and the line L2. The transistor Tr11 is electrically connected to the line L1 through the transistors Tr17 and Tr18 and is electrically connected to the node V1. The transistor Tr21 is electrically connected to the node V1 and is electrically connected to the line L2 through the transistors Tr27 and Tr28. A gate of the transistor Tr17 and a gate of the transistor Tr27 are electrically connected to the node VRC. A gate of the transistor Tr18 and a gate of the transistor Tr28 are electrically connected to the node V2. In the present embodiment, the transistors Tr11, Tr17, and Tr18 are p-MOSFETs and the transistors Tr21, Tr27, and Tr28 are n-MOSFETs. The transistors Tr11 and Tr21 output the voltage V1 with a logic level that is an inversion of a logic level of the voltage VRC. The transistors Tr17, Tr18, Tr27, and Tr28 have a function to cause the voltage V1 to have hysteresis so that the ESD protection circuit 1 stably operates when the VCCQ voltage of the pad P1 varies. Circuits of these transistors Tr11, Tr17, Tr18, Tr21, Tr27, and Tr28 are also referred to as power supply noise filter circuits (Schmitt triggers).

A gate of the transistor Tr12 and a gate of the transistor Tr22 are electrically connected to the node V1. The transistor Tr12 and the transistor Tr22 are connected in series to each other between the line L1 and the line L2. The transistor Tr12 is located between the line L1 and the node V2. The transistor Tr22 is located between the node V2 and the line L2. In the present embodiment, the transistor Tr12 is a p-MOSFET and the transistor Tr22 is an n-MOSFET. The transistors Tr12 and Tr22 output a voltage V2 with a logic level that is an inversion of the logic level of the voltage V1. Circuits of these transistors Tr12 and Tr22 function as buffer circuits that amplify and invert the voltage V1.

The resistance R2 is located between the node V2 and the node V3'. The capacitor C2 is located between the node V3' and the line L2. The node V3' is located downstream of the node V2. The resistance R2 and the capacitor C2 function as a filter circuit (a low-pass filter) that reduces oscillation of the voltage V2.

A gate of the transistor Tr13 and a gate of the transistor Tr23 are electrically connected to the node V3'. The transistor Tr13 and the transistor Tr23 are connected in series to each other between the line L1 and the line L2. The transistor Tr13 is located between the line L1 and the node V3. The transistor Tr23 is located between the node V3 and the line L2. In the present embodiment, the transistor Tr13 is a p-MOSFET and the transistor Tr23 is an n-MOSFET. The transistors Tr13 and Tr23 output a voltage V3 with a logic level that is an inversion of a logic level of a voltage V3'. Circuits of these transistors Tr13 and Tr23 function as buffer circuits that amplify and invert the voltage V3'.

A gate of the transistor Tr14 and a gate of the transistor Tr24 are electrically connected to the node V4'. The node V4' of the present embodiment, which is electrically connected to the node V3, is at the same potential as the node V3. The transistor Tr14 and the transistor Tr24 are connected in series to each other between the line L1 and the line L2. The transistor Tr14 is located between the line L1 and the node V4. The transistor Tr24 is located between the node V4 and the line L2. In the present embodiment, the transistor Tr14 is a p-MOSFET and the transistor Tr24 is an n-MOSFET. The transistors Tr14 and Tr24 output a voltage V4 with a logic level that is an inversion of a logic level of a voltage V4'. Circuits of these transistors Tr14 and Tr24 function as buffer circuits that amplify and invert the voltage V4'.

A gate of the transistor Tr1 is electrically connected to the node V4. The transistor Tr1 is electrically connected to the node V3 through the resistance R3 and is electrically connected to the line L2. Specifically, the resistance R3 is electrically connected to a line between the node V3 and the node V4'. In the present embodiment, the transistor Tr1 is an n-MOSFET. The circuits of the transistors Tr13, Tr23, Tr14, Tr24, and Tr1 of the present embodiment function as voltage detecting circuits that detect a voltage resulting from surge. This makes it possible to determine whether or not surge occurs.

The resistance R4 is located between the node V4' and the line L2. Specifically, the resistance R4 is electrically connected to a line between the node V4' and the node V5'.

A gate of the transistor Tr15 and a gate of the transistor Tr25 are electrically connected to the node V5'. The node V5' of the present embodiment, which is electrically connected to the nodes V3 and V4', is at the same potential as the nodes V3 and V4'. The transistor Tr15 and the transistor Tr25 are connected in series to each other between the line L1 and the line L2. The transistor Tr15 is electrically connected to the line L1 and is electrically connected to the node V5 through the resistance R5. The transistor Tr25 is electrically connected to the node V5 and is electrically connected to the line L2. In the present embodiment, the transistor Tr15 is a p-MOSFET and the transistor Tr25 is an n-MOSFET. The transistors Tr15 and Tr25 output a voltage V5 with a logic level that is an inversion of a logic level of a voltage V5'. Circuits of these transistors Tr15 and Tr25 function as buffer circuits that amplify and invert the voltage V5'.

The resistance R6 is located between the node V5 and the node V6'. The capacitor C3 is located between the node V6' and the line L2. The node V6' is located downstream of the node V5. The resistance R6 and the capacitor C3 function as a filter circuit (a low-pass filter) that reduces oscillation of the voltage V5.

A gate of the transistor Tr16 and a gate of the transistor Tr26 are electrically connected to the node V6'. The transistor Tr16 and the transistor Tr26 are connected in series to each other between the line L1 and the line L2. The transistor Tr16 is located between the line L1 and the node V6. The transistor Tr26 is located between the node V6 and the line L2. In the present embodiment, the transistor Tr16 is a p-MOSFET and the transistor Tr26 is an n-MOSFET. The transistors Tr16 and Tr26 output a voltage V6 with a logic level that is an inversion of a logic level of a voltage V6'. Circuits of these transistors Tr16 and Tr26 function as buffer circuits that amplify and invert the voltage V6'. The circuits of the transistors Tr15, Tr25, Tr16, and Tr26 of the present embodiment function as discharge drive circuits that cause the transistor Tr3 to discharge surge charge in the ESD protection circuit 1. The transistor Tr2 and the NOR circuit 21 are also involved in an operation of the discharge drive circuit.

The NOR circuit 21 receives the voltage V5' from the node V5' at one of input terminals and the voltage VRC from the node VRC at the other input terminal. The NOR circuit 21 then performs a NOR calculation of the voltage V5' and the voltage VRC and outputs a voltage VRC1 obtained by the NOR calculation from an output terminal. The voltage V5' is an example of a first signal, the voltage VRC1 is an example of a second signal, and the voltage VRC is an example of a third signal. The operation of the NOR circuit 21 will be described later in more detail.

The transistor Tr2 includes a control terminal (gate) that receives the voltage VRC1. One of main terminals (source and drain) of the transistor Tr2 is electrically connected to the node GIN and the other main terminal of the transistor Tr2 is electrically connected to the NOR circuit 21. The node GIN is located between the node V6 and the gate of the transistor Tr3 and is at the same potential as the node V6. The transistor Tr2, which is controlled by the voltage VRC1 from the NOR circuit 21, outputs a control signal S for controlling the NOR circuit 21 to the NOR circuit 21. In the present embodiment, the transistor Tr2 is an n-MOSFET.

The transistor Tr3 includes a gate electrically connected to the node GIN. The transistor Tr3 is located between the line L1 and the line L2. The transistor Tr3 is turned on in response to a steep rise in the VCCQ voltage, causing an ON-current to flow from the line L1 to the line L2 through the transistor Tr3. This makes it possible to reduce an influence of a rapid change in the VCCQ voltage on the protection target circuit. For example, surge charge occurring in the ESD protection circuit 1 is discharged from the line L1 into the line L2 through the transistor Tr3. The transistor Tr3 is also referred to as a discharging transistor. In the present embodiment, the transistor Tr3 is an n-MOSFET.

The ESD protection circuit 1 of the present embodiment will be described later in more detail.

Figure 2:
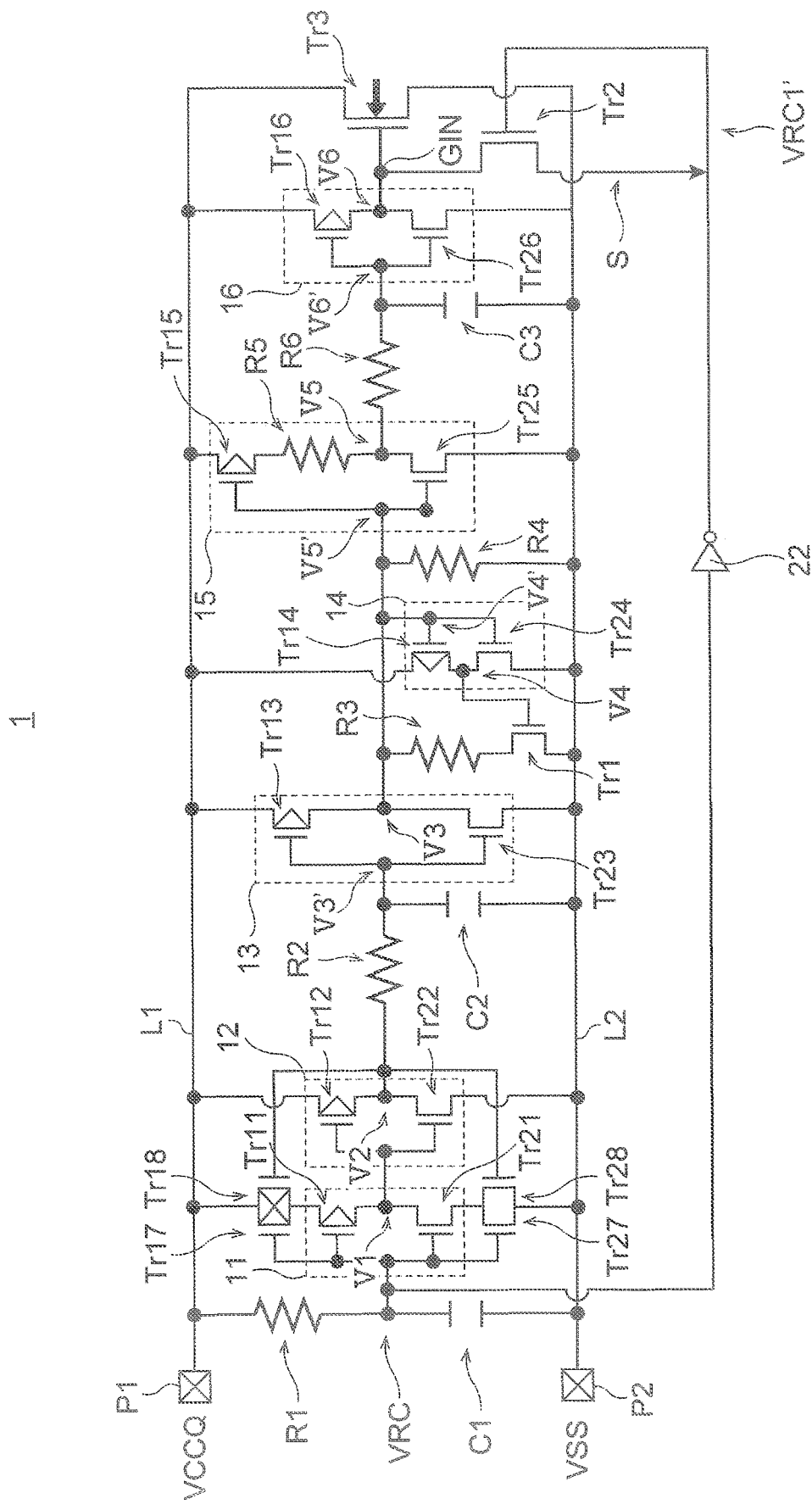
FIG. 2 is a circuit diagram showing a configuration of an ESD protection circuit of a comparative example of the first embodiment.
Figure 3:
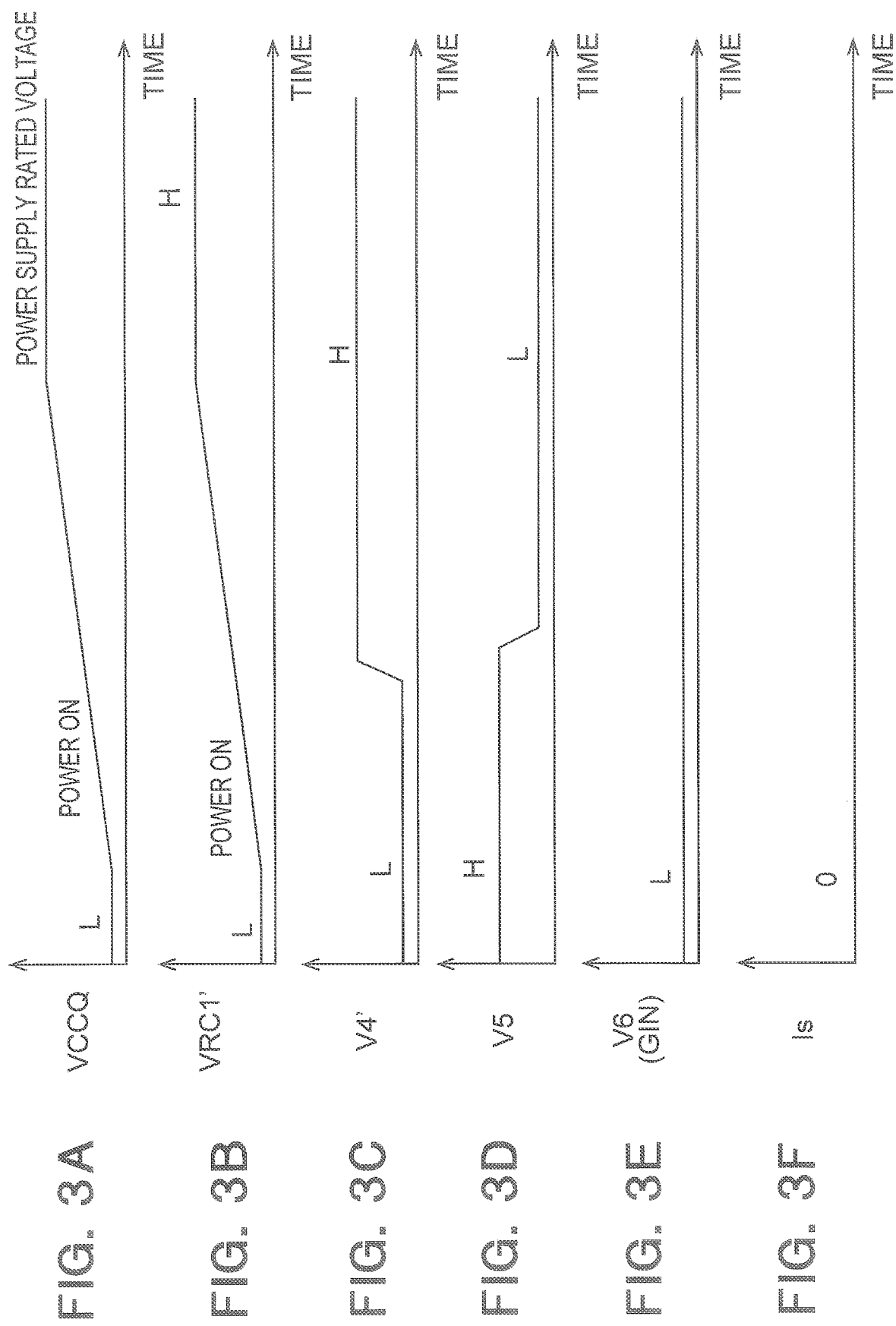
FIGS. 3A to 3F are timing charts showing an example of an operation of the ESD protection circuit of the comparative example.

FIG. 2 is a circuit diagram showing a configuration of an ESD protection circuit 1 of a comparative example of the first embodiment.

The ESD protection circuit 1 of the present comparative example has a configuration where the NOR circuit 21 of the ESD protection circuit 1 of the present embodiment is replaced with a NOT circuit (a NOT gate, an inverter) 22. The NOT circuit 22 receives the voltage VRC from the node VRC at an input terminal. The NOT circuit 22 then performs a NOT calculation on the voltage VRC and outputs a voltage obtained by the NOT calculation from an output terminal. The voltage outputted from the NOT circuit 22 and the control signal S outputted from the transistor Tr2 are supplied to the same node and a voltage VRC1' is supplied from the node to the gate of the transistor Tr2.

Next, description will be made on an operation of the ESD protection circuit 1 of the present comparative example.

In turning on the ESD protection circuit 1 of the present comparative example, it is necessary to fix the voltage GIN at the VSS voltage to reduce a flow-through current in the transistor Tr3 resulting from a rise in the voltage GIN due to gate coupling of the transistor Tr3.

The ESD protection circuit 1 of the present comparative example includes, as paths that fix the voltage GIN at the VSS voltage, two paths. A first path is a path for turning the voltage GIN into the VSS voltage through the inverter 16, which operates after the node VRC is charged. The first path leads to the node GIN from the node VRC through the nodes V1, V2, V3, V4, V5, and V6. A second path is a path for turning on the transistor Tr2 via the NOT circuit 22 in response to the voltage VRC being low and turns the voltage GIN into the VSS voltage. The second path leads to the transistor Tr2 from the node VRC through the NOT circuit 22.

Immediately after turned on, the ESD protection circuit 1 of the present comparative example turns the voltage GIN into the VSS voltage through the second path. The ESD protection circuit 1 of the present comparative example also turns off the second path after the voltage GIN is fixed at the VSS voltage through the first path. No flow-through current occurs in the transistor Tr3 during a switch from the first path to the second path.

Further, in applying surge to the ESD protection circuit 1 of the present comparative example, the surge causes the VCCQ voltage to steeply rise. This causes the logic level of the voltage V4' to be high (H) and also causes the logic level of the voltage GIN to be high. As a result, surge charge is discharged through the transistor Tr3.

FIGS. 3A to 3F are timing charts showing an example of an operation of the ESD protection circuit 1 of the comparative example.

FIGS. 3A to 3F show an example of an operation responsive to the ESD protection circuit 1 of the present comparative example being turned on. In response to the ESD protection circuit 1 of the present comparative example being turned on, the VCCQ voltage rises toward a power supply rated voltage and, accordingly, the voltage VRC1' also rises. This causes the logic level of the voltage V4' to change from low (L) to high and, subsequently, causes the logic level of the voltage V5 from high to low. Meanwhile, the voltage V6 (=the voltage GIN) is still low. Further, no surge is applied to the ESD protection circuit 1 in FIGS. 3A to 3F, so that a current Is flowing through the transistor Tr3 is zero. The current Is becomes a positive value in response to an ON-current flowing through the transistor Tr3.

Figure 4:
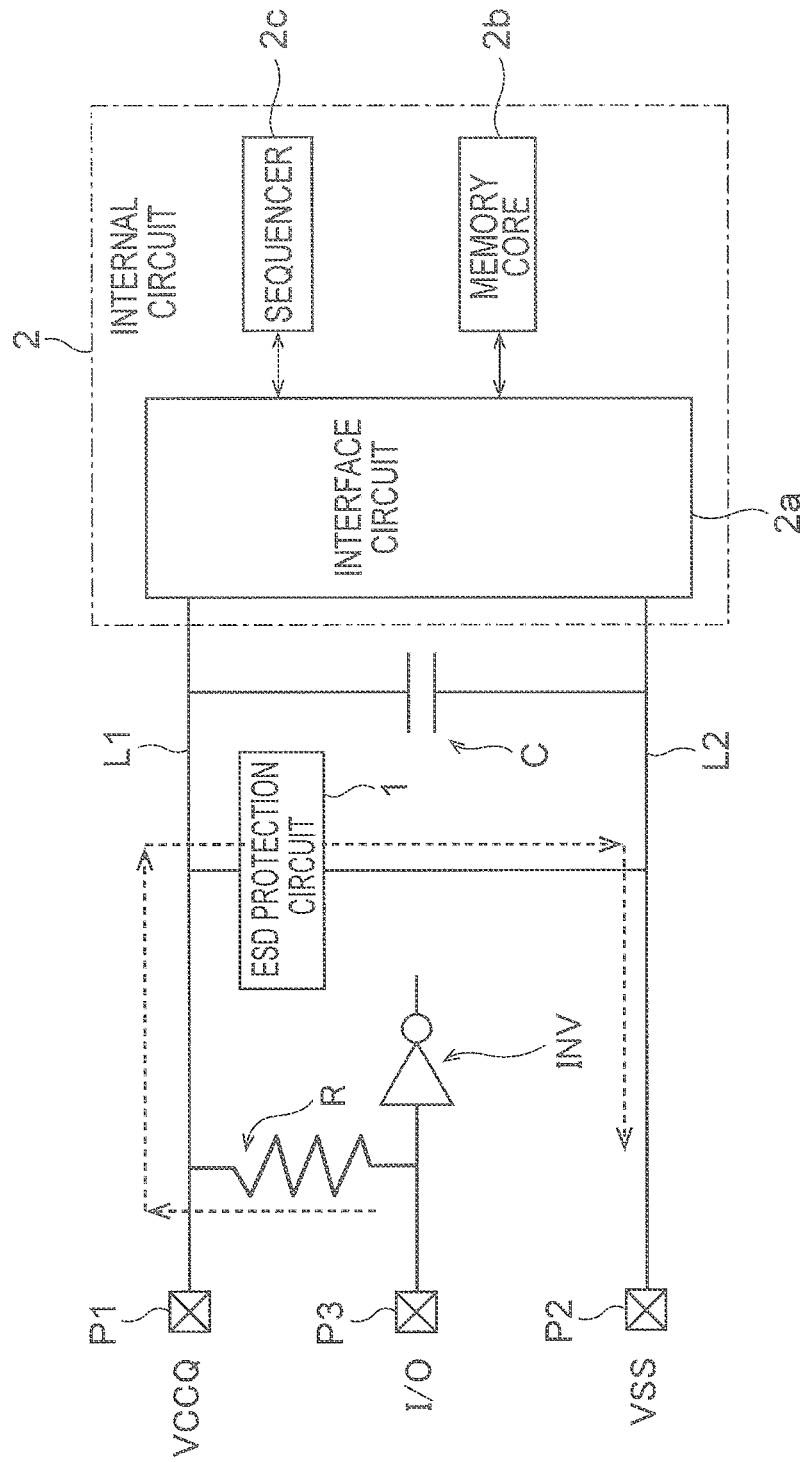
FIG. 4 is a circuit diagram showing a configuration of a semiconductor device of the first embodiment.

FIG. 4 is a circuit diagram showing a configuration of the semiconductor device of the first embodiment. The configuration shown in FIG. 4 is common to the semiconductor device of the present embodiment and a semiconductor device of the comparative example.

The semiconductor device of the present embodiment includes the ESD protection circuit 1 and an internal circuit 2, which is an example of the protection target circuit, as shown in FIG. 4. The internal circuit 2 is, for example, a three-dimensional memory. The internal circuit 2 of the present embodiment includes, as components of the three-dimensional memory, an interface circuit 2a, a memory core 2b, and a sequencer 2c.

The semiconductor device of the present embodiment also includes the pad P1, the pad P2, at least one pad P3, the line L1, the line L2, an inverter INV, a resistance R, and a capacitor C as shown in FIG. 4. The pad P3 is an I/O (input/output) pad of the semiconductor device of the present embodiment. The inverter INV includes an input terminal electrically connected to the pad P3. The resistance R is electrically connected to the line L1 and a node between the pad P3 and the inverter INV. The capacitor C is electrically connected to the line L1 and the line L2 between the ESD protection circuit 1 and the internal circuit 2.

The interface circuit 2a is intervenient between the pads P1 to P3 and the other circuits in the internal circuit 2. The interface circuit 2a, for example, sends a command signal and an address signal from the pad P3 to the sequencer 2c, sends a data signal from the pad P3 to the memory core 2b, and sends a data signal from the memory core 2b to the pad P3. The interface circuit 2a is also electrically connected to the lines L1 and L2. The memory core 2b includes a plurality of memory cells. The sequencer 2c controls various operations of the semiconductor device of the present embodiment on the basis of the command signal and the address signal received from the interface circuit 2a.

Arrows in FIG. 4 show a path of discharge in a case where surge is applied to the pad P3. The surge charge in this case is discharged through the resistance R, the line L1, and the ESD protection circuit 1 (the transistor Tr3) into the line L2. This makes it possible to protect the internal circuit 2 from static electricity. The semiconductor device of the present embodiment supplies the VCCQ voltage with surge reduced by the ESD protection circuit 1 to the interface circuit 2a through the line L1.

Figure 5B:
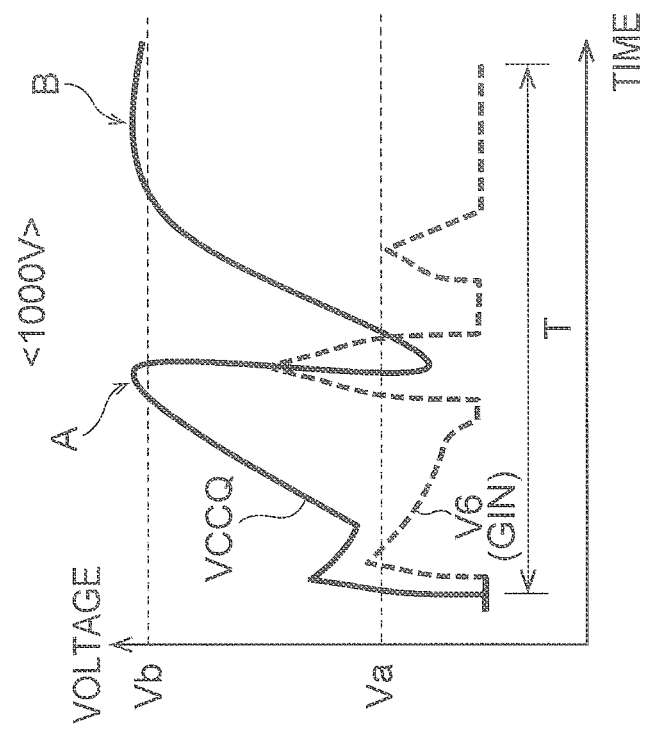
FIGS. 5A and 5B are graphs for explaining an operation of the ESD protection circuit of the comparative example.
Figure 5A:
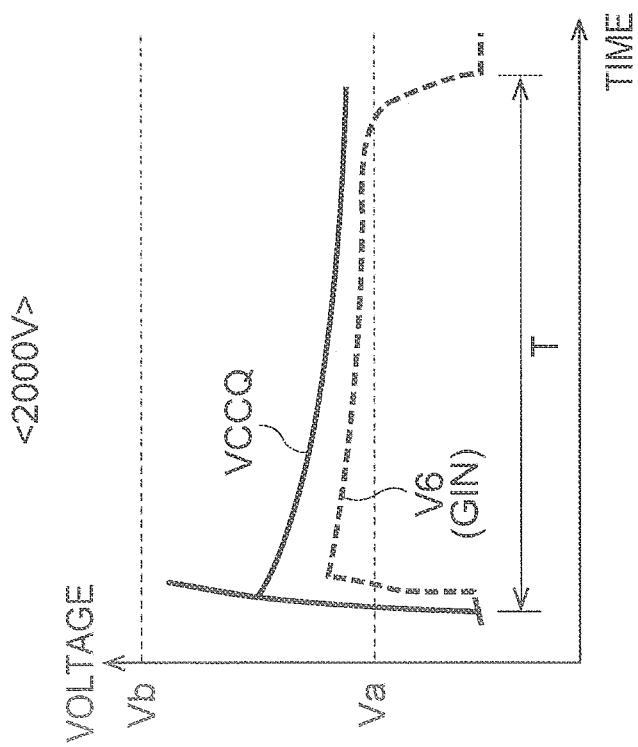

FIGS. 5A and 5B are graphs for explaining an operation of the ESD protection circuit 1 of the comparative example.

Here, description will be made on problems associated with a reduction in an ESD test voltage of the ESD protection circuit 1 of the present comparative example. FIG. 5A shows time variations in the VCCQ voltage and the voltage GIN at an ESD test voltage of 2000 V. FIG. 5B shows time variations in the VCCQ voltage and the voltage GIN at an ESD test voltage of 1000 V. A reference sign Va denotes a circuit operation minimum voltage, a reference sign Vb denotes pressure resistance criteria, and a reference sign T denotes an RC timer period.

A change in the ESD test voltage from 2000 V to 1000 V reduces a surge current, lowering a maximum value of the VCCQ voltage during surge application. Accordingly, a discharge operation is expected around the circuit operation minimum voltage of the ESD protection circuit 1. However, for the ESD protection circuit 1 of the present comparative example, the voltage GIN during discharge is determined as "VCCQ voltage−I(Tr2)×Ron(Tr2)" and the voltage GIN is lower than the VCCQ voltage. This reduces a discharge margin of the transistor Tr3. As a result, discharge by the transistor Tr3 would be insufficient and a rise in voltage attributed to residual charge becomes a factor for a violation of the pressure resistance criteria. Here, I(Tr2) denotes a current flowing through the transistor Tr2 and Ron(Tr2) denotes an ON-resistance of the transistor Tr2.

In FIG. 5B, the VCCQ voltage exceeds the pressure resistance criteria at points of time pointed by arrows A and B. At these points of time, a rise in voltage attributed to residual charge causes a violation of the pressure resistance criteria. Immediately before these points of time, the voltage GIN falls below the circuit operation minimum voltage, which becomes a cause of the residual charge.

In contrast, the ESD protection circuit 1 of the present embodiment, which includes the NOR circuit 21 in place of the NOT circuit 22, supplies the voltage VRC and the voltage V5' to the NOR circuit 21 (FIG. 1). Consequently, a gate potential (i.e., the voltage VRC1) of the transistor Tr2, which lowers the voltage GIN, becomes low in response to the voltage V5' becoming high during application of surge to the ESD protection circuit 1. This makes it possible to turn off the transistor Tr2, so that the voltage GIN can be increased to the VCCQ voltage. This will be described with reference to FIGS. 6A and 6B.

Figure 6A:
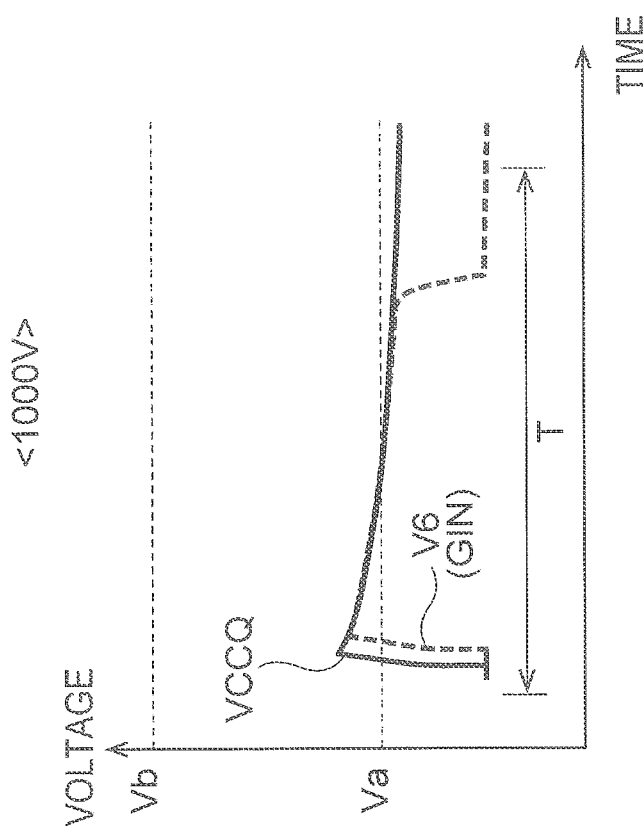
FIGS. 6A and 6B are graphs for explaining an operation of the ESD protection circuit of the first embodiment.
Figure 6B:
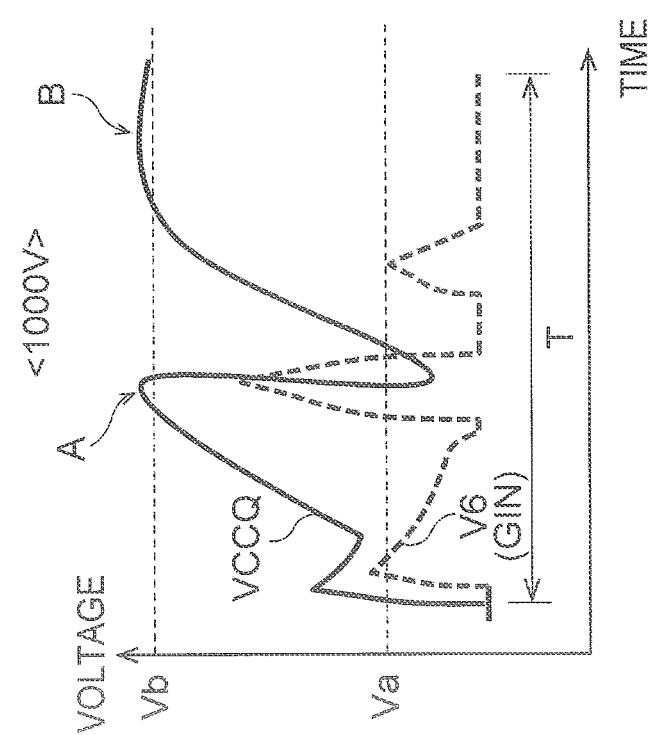

FIGS. 6A and 6B are graphs for explaining an operation of the ESD protection circuit 1 of the first embodiment.

FIG. 6A relates to the ESD protection circuit 1 of the comparative example, showing time variations in the VCCQ voltage and the voltage GIN at an ESD test voltage of 1000 V. The graph in FIG. 6A is the same as the graph in FIG. 5(b). FIG. 6B relates to the ESD protection circuit 1 of the present embodiment, showing time variations in the VCCQ voltage and the voltage GIN at an ESD test voltage of 1000 V.

In the comparative example (FIG. 6A), the voltage GIN during discharge is lower than the VCCQ voltage. This causes the gate potential of the transistor Tr1 to fall below a threshold voltage of the transistor Tr1 before inversion of the logic level of a voltage outputted from the NOT circuit 22. As a result, deficiency of discharge attributed to cutoff of the transistor Tr1 occurs and the residual charge causes a violation of the pressure resistance criteria.

In contrast, in the present embodiment (FIG. 6B), the voltage GIN can be increased to the VCCQ voltage during surge application. This makes it possible to reduce the occurrence of cutoff of the transistor Tr1 before inversion of the logic level of the voltage (VRC1) outputted from the NOR circuit 21. Therefore, the present embodiment makes it possible to reduce the occurrence of deficiency of discharge attributed to cutoff of the transistor Tr1 and, consequently, reduce a violation of the pressure resistance criteria caused by the residual charge. The present embodiment also makes it possible to achieve such an effect without interfering with measures against a flow-through current at turn-on and, consequently, achieve favorable circuit characteristics of the ESD protection circuit 1 at turn-on as in the comparative example.

Figure 7A:
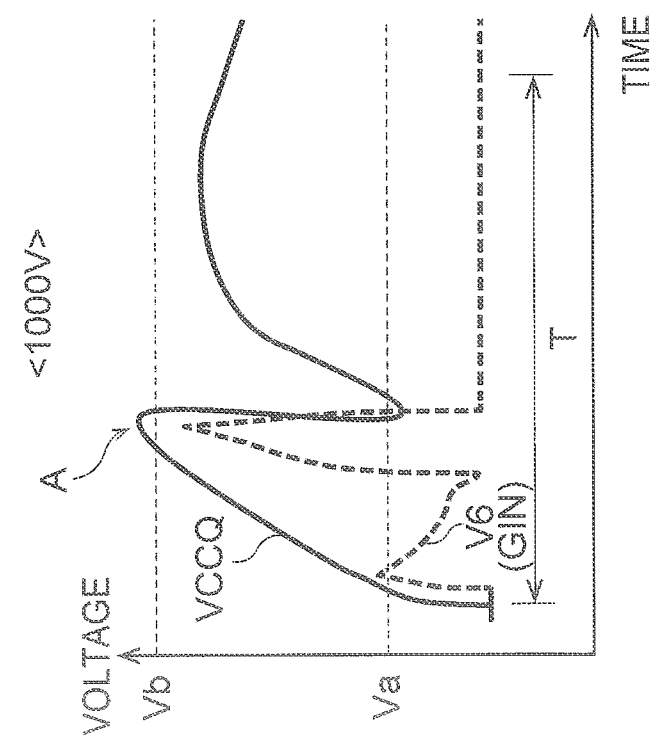
FIGS. 7A and 7B are other graphs for explaining the operation of the ESD protection circuit of the first embodiment.
Figure 7B:
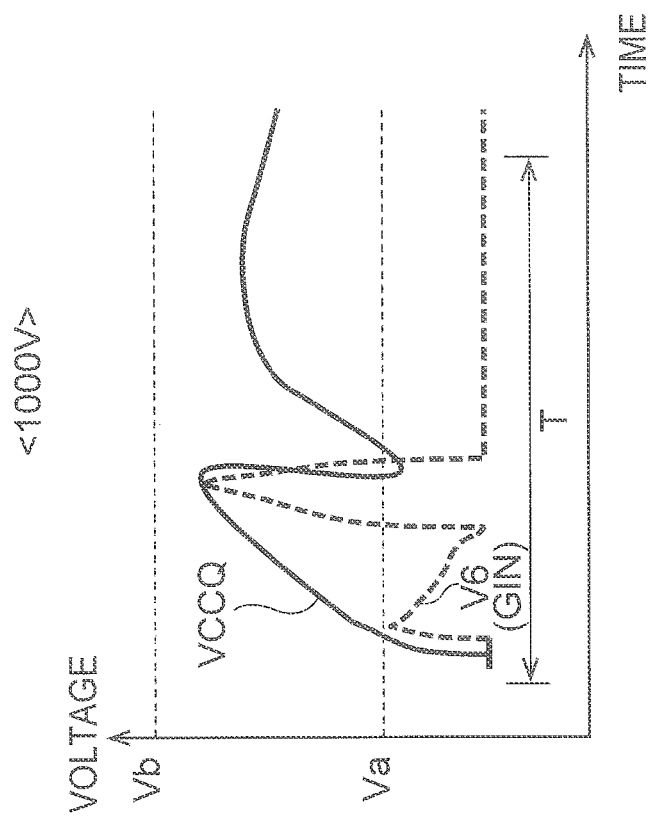

FIGS. 7A and 7B are other graphs for explaining the operation of the ESD protection circuit 1 of the first embodiment.

FIG. 7A relates to the ESD protection circuit 1 of the comparative example, showing time variations in the VCCQ voltage and the voltage GIN at an ESD test voltage of 1000 V. FIG. 7B relates to the ESD protection circuit 1 of the present embodiment, showing time variations in the VCCQ voltage and the voltage GIN at an ESD test voltage of 1000 V. FIGS. 7A and 7B show time variations in the VCCQ voltage and the voltage GIN caused in a case where a difference between the operation of the ESD protection circuit 1 of the comparative example and the operation of the ESD protection circuit 1 of the present embodiment is small as compared with the cases in FIGS. 6A and 6B.

In the comparative example (FIG. 7A), the voltage GIN during discharge is lower than the VCCQ voltage. This would cause the gate potential of the transistor Tr1 to fall below a threshold voltage of the transistor Tr1 before inversion of the logic level of a voltage outputted from the NOT circuit 22. In this case, no discharge is performed by the transistor Tr1, so that inflow of charge causes a rise in the VCCQ voltage. Therefore, the transistor Tr1 discharges the charge with a rise in the VCCQ voltage. However, a sufficient VGS (a gate-to-source voltage) fails to be ensured in the transistor Tr1, so that discharge becomes insufficient, causing a violation of the pressure resistance criteria.

In contrast, in the present embodiment (FIG. 7B), the voltage GIN can be increased to the VCCQ voltage during surge application. This makes it possible to reduce the occurrence of a violation of the pressure resistance criteria attributed to deficiency of discharge.

As described above, the ESD protection circuit 1 of the present embodiment includes the NOR circuit 21, which receives the voltage V5' at one of the input terminals and the VCCQ voltage at the other input terminal and outputs the voltage VRC1 obtained by subjecting the voltage V5' and the VCCQ voltage to calculation to the transistor Tr2. Therefore, the present embodiment makes it possible to favorably discharge surge charge in the ESD protection circuit 1. For example, it is possible to reduce a violation of the pressure resistance criteria caused by the residual charge.

Such an effect is also achievable by using an arithmetic circuit other than the NOR circuit 21. Examples of such an arithmetic circuit will be described in embodiments below.

Second Embodiment

Figure 8:
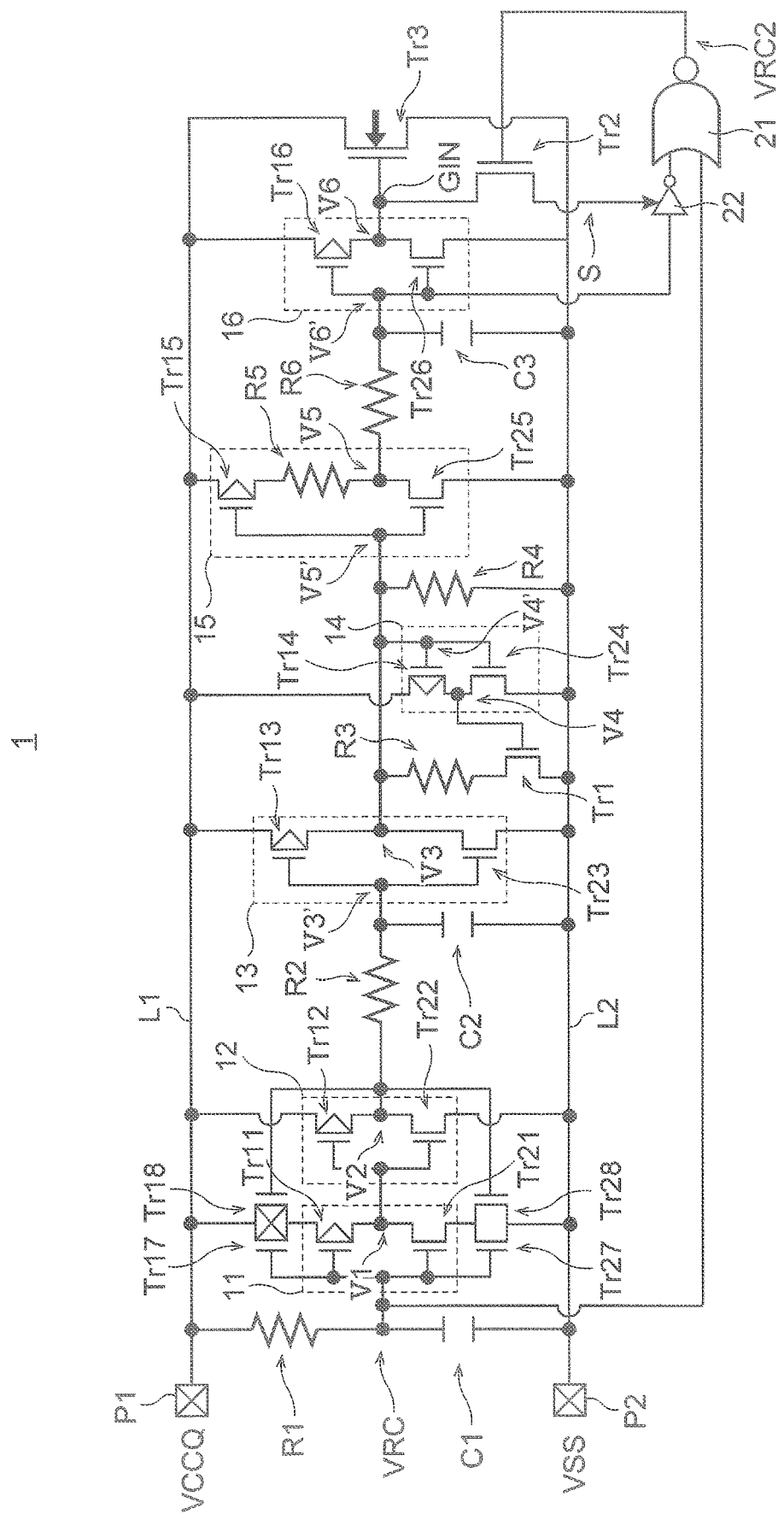
FIG. 8 is a circuit diagram showing a configuration of an ESD protection circuit of a second embodiment.

FIG. 8 is a circuit diagram showing a configuration of an ESD protection circuit 1 of a second embodiment.

The ESD protection circuit 1 of the present embodiment has a configuration where the NOR circuit 21 of the first embodiment is replaced with a combination of the NOR circuit 21 and the NOT circuit 22. The combination of the NOR circuit 21 and the NOT circuit 22 of the present embodiment is an example of the arithmetic circuit.

In the present embodiment, the NOT circuit 22 receives the voltage V6' from the node V6' at an input terminal. The NOT circuit 22 then performs a NOT calculation of the voltage V6' and outputs a voltage obtained by the NOT calculation from an output terminal. The voltage V6' is an example of the first signal and the voltage outputted from the NOT circuit 22 is an example of a fourth signal.

Further, in the present embodiment, the NOR circuit 21 receives the voltage outputted from the NOT circuit 22 at one of the input terminals and the voltage VRC from the node VRC at the other input terminal. The NOR circuit 21 then performs a NOR calculation on the voltage outputted from the NOT circuit 22 and the voltage VRC and outputs a voltage VRC2 obtained by the NOR calculation from an output terminal. The transistor Tr2 of the present embodiment, which has a gate for receiving the voltage VRC2, is controlled by the voltage VRC2 from the NOR circuit 21 and outputs the control signal S for controlling the NOT circuit 22 to the NOT circuit 22. The voltage VRC2 is an example of the second signal and the voltage VRC is an example of the third signal.

In the present embodiment, the gate potential (i.e., the voltage VRC2) of the transistor Tr2, which lowers the voltage GIN, becomes low in response to the voltage V6' becoming low during application of surge to the ESD protection circuit 1. This makes it possible to turn off the transistor Tr2, so that the voltage GIN can be lowered to the VCCQ voltage.

Third Embodiment

Figure 9:
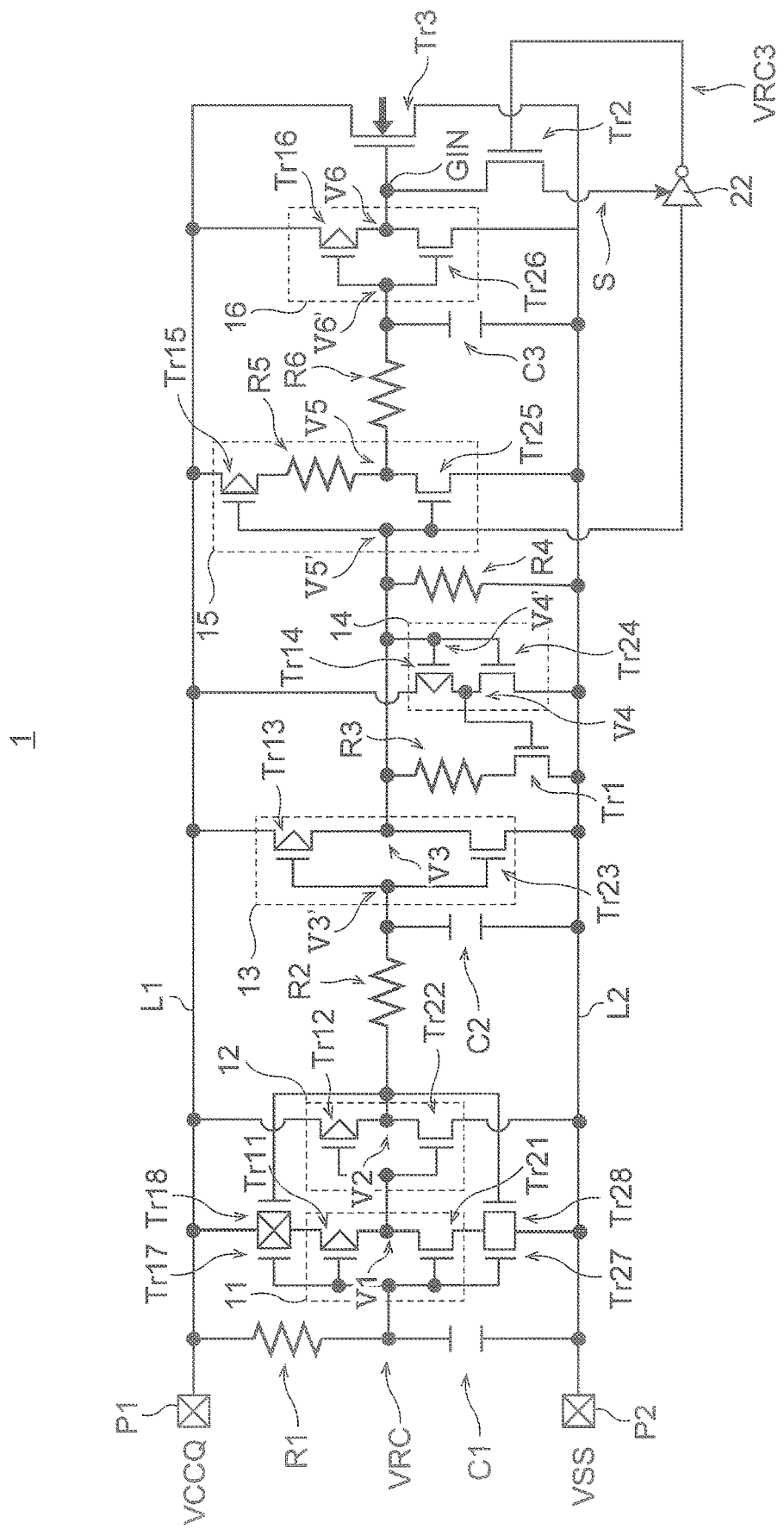
FIG. 9 is a circuit diagram showing a configuration of an ESD protection circuit of a third embodiment.

FIG. 9 is a circuit diagram showing a configuration of an ESD protection circuit 1 of a third embodiment.

The ESD protection circuit 1 of the present embodiment has a configuration where the NOR circuit 21 of the ESD protection circuit 1 of the present embodiment is replaced with the NOT circuit 22. The NOT circuit 22 of the present embodiment is an example of the arithmetic circuit.

In the present embodiment, the NOT circuit 22 receives the voltage V5' from the node V5' at an input terminal. The NOT circuit 22 then performs a NOT calculation on the voltage V5' and outputs a voltage VRC3 obtained by the NOT calculation from an output terminal. The transistor Tr2 of the present embodiment, which has a gate for receiving the voltage VRC3, is controlled by the voltage VRC3 from the NOT circuit 22 and outputs the control signal S for controlling the NOT circuit 22 to the NOT circuit 22. The voltage V5' is an example of the first signal and the voltage VRC3 is an example of the second signal.

In the present embodiment, the gate potential (i.e., the voltage VRC3) of the transistor Tr2, which lowers the voltage GIN, becomes low in response to the voltage V5' becoming high during application of surge to the ESD protection circuit 1. This makes it possible to turn off the transistor Tr2, so that the voltage GIN can be increased to the VCCQ voltage.

Fourth Embodiment

Figure 10:
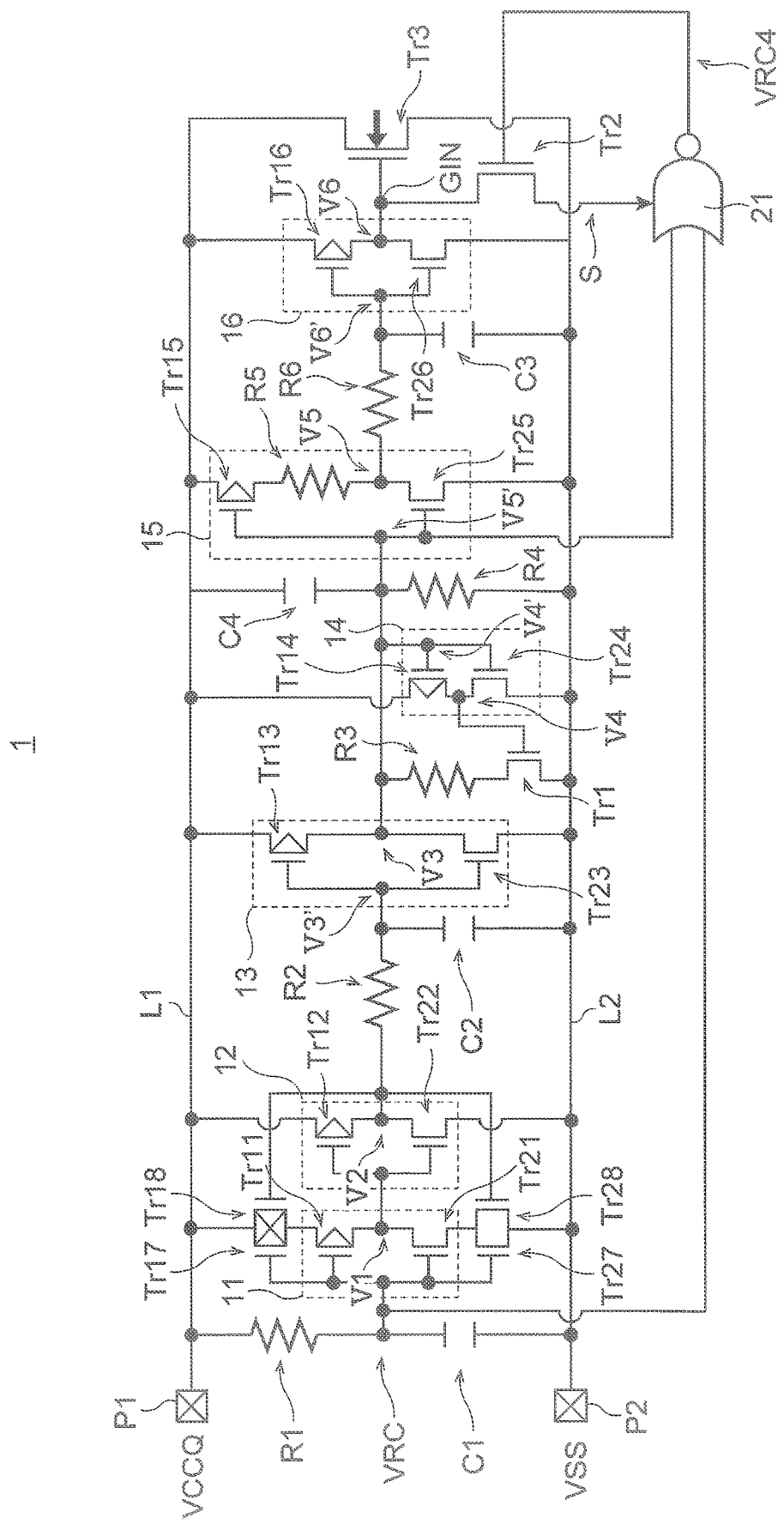
FIG. 10 is a circuit diagram showing a configuration of an ESD protection circuit of a fourth embodiment.

FIG. 10 is a circuit diagram showing a configuration of an ESD protection circuit 1 of a fourth embodiment.

The ESD protection circuit 1 of the present embodiment includes a capacitor C4 in addition to the components of the ESD protection circuit 1 of the first embodiment. The capacitor C4 and the resistance R4 are connected in series to each other between the line L1 and the line L2. The capacitor C4 is located between the line L1 and the nodes V3, V4', and V5'. The resistance R4 is located between the nodes V3, V4', and V5' and the line L2. The capacitor C4 and the resistance R4 of the present embodiment function as a filter circuit (a high-pass filter) electrically connected to the nodes V3, V4', and V5'. This filter circuit is located between the line L1 and the line L2 downstream of the inverters 11 to 14 and the transistor Tr1 and upstream of the inverters 15 to 16 and the transistors Tr2 to Tr3.

In the present embodiment, the NOR circuit 21 receives the voltage V5' from the node V5' at one of input terminals and the voltage VRC from the node VRC at the other input terminal. The NOR circuit 21 then performs a NOR calculation on the voltage V5' and the voltage VRC and outputs a voltage VRC4 obtained by the NOR calculation from an output terminal. The transistor Tr2 of the present embodiment, which has a gate for receiving the voltage VRC4, is controlled by the voltage VRC4 from the NOR circuit 21 and outputs the control signal S for controlling the NOR circuit 21 to the NOR circuit 21. The voltage V5' is an example of the first signal, the voltage VRC4 is an example of the second signal, and the voltage VRC is an example of the third signal.

Next, the ESD protection circuit 1 of the first embodiment and the ESD protection circuit 1 of the fourth embodiment will be compared with each other.

In the ESD protection circuit 1 (FIG. 1) of the first embodiment, a change in the ESD test voltage from 2000 V to 1000 V reduces the surge current, causing a slope of a rise in the VCCQ voltage during application of surge to become moderate. For this reason, in some configurations of the voltage detecting circuit in the ESD protection circuit 1, the voltage detecting circuit fails to follow the slope of the rise in the VCCQ voltage, so that transition of the voltage V4' to high would be failed. As a result, detection of voltage during application of surge has an error and deficiency of discharge would occur. In addition, residual charge causes a rise in the VCCQ voltage and a violation of the pressure resistance criteria would occur. Further, settings of a voltage detected by the voltage detecting circuit, which are set by an impedance balance between a charge side and a discharge side, are likely to be collapsed by elements such as a PVT and a power supply voltage. Accordingly, it is desirable to ensure an operation margin.

In contrast, the ESD protection circuit 1 (FIG. 10) of the fourth embodiment includes a high-pass filter including the capacitor C4 and the resistance R4. This makes it possible to raise the voltage V4' to high during application of surge.

In the present embodiment, it is desirable that a cutoff frequency of this high-pass filter be set lower than an operation frequency (a power supply rising frequency) of the VCCQ voltage during application of surge. This makes it possible for the high-pass filter to contribute as a coupling capacitance for a rise in the VCCQ voltage during application of surge. In addition, with regard to a rise in the VCCQ voltage at turn-on, filtering is performed by the high-pass filter, which makes it possible to prevent deterioration of a function to reduce a flow-through current. A capacitance value and a shape of the capacitor C4 and a resistance value and a shape of the resistance R4 may be selected as desired.

In the first embodiment, the voltage V4' would fail to be pulled up to a high level during application of surge, causing the occurrence of a violation of the pressure resistance criteria attributed to residual charge resulting from deficiency of discharge. In contrast, the fourth embodiment makes it possible to pull up the voltage V4' to a high level during application of surge and, consequently, makes it possible to reduce the occurrence of such a violation of the pressure resistance criteria. In a case where a violation of the pressure resistance criteria does not matter in the first embodiment, the configuration of ESD protection circuit 1 of the first embodiment including no capacitor C4 may be employed, which makes it possible to reduce costs by an amount corresponding to the capacitor C4.

The semiconductor device of the present embodiment may include, in a single semiconductor chip, a plurality of ESD protection circuits 1 having the configuration shown in FIG. 10. In this case, the capacitance value and shape of the capacitor C4 and the resistance value and shape of the resistance R4 may be the same among all the ESD protection circuits 1 or different among the ESD protection circuits 1.

Further, the capacitor C4 and the high-pass filter of the present embodiment may be provided in the ESD protection circuit 1 of the second or third embodiment. In this case, the semiconductor device of the second or third embodiment may include, in a single semiconductor chip, a plurality of ESD protection circuits 1 having the configuration shown in FIG. 8 or FIG. 9. In this case, the capacitance value and shape of the capacitor C4 and the resistance value and shape of the resistance R4 may be the same among all the ESD protection circuits 1 or different among the ESD protection circuits 1.

Further, the ESD test voltage is 2000 V or 1000 V herein; however, the ESD test voltage in the embodiments may be any other value. The values of 2000 V and 1000 V are examples for explaining the operations of the ESD protection circuits 1 in the embodiments. An actual voltage to be applied is determined in accordance with a specification of a voltage to be applied determined for each semiconductor device product.

While certain embodiments have been described, these embodiments have been presented by way of example only, and are not intended to limit the scope of the inventions. Indeed, the novel devices and circuits described herein may be embodied in a variety of other forms; furthermore, various omissions, substitutions and changes in the form of the devices and circuits described herein may be made without departing from the spirit of the inventions. The accompanying claims and their equivalents are intended to cover such forms or modifications as would fall within the scope and spirit of the inventions.

The invention claimed is:

1. A semiconductor device comprising:
a protection circuit electrically connected to a first line to be supplied with a first voltage and a second line to be supplied with a second voltage; and
a protection target circuit electrically connected to the first line and the second line downstream of the protection circuit, and to be protected by the protection circuit,
the protection circuit comprising:
first and second transistors including gates electrically connected to a first node, and connected in series to each other between the first and second lines;
third and fourth transistors including gates electrically connected to a second node between the first and second transistors, and connected in series to each other between the first and second lines;
a fifth transistor including a gate electrically connected to a third node between the third and fourth transistors, and provided between the second node and the second line;
an arithmetic circuit configured to receive a first signal from the second node or a fourth node located downstream of the second node, and output a second signal obtained by calculation using the first signal; and
a sixth transistor electrically connected to a fifth node located downstream of the second node, and configured to receive the second signal from the arithmetic circuit and output a control signal to the arithmetic circuit.

2. The device of claim 1, wherein the arithmetic circuit is configured to receive a third signal from a sixth node located upstream of the first node, and output the second signal obtained by calculation using the first and third signals.

3. The device of claim 2, wherein the arithmetic circuit comprises a NOR circuit configured to output the second signal obtained by a NOR calculation of the first signal and the third signal.

4. The device of claim 2, wherein the arithmetic circuit comprises a NOT circuit configured to output a fourth signal obtained by a NOT calculation of the first signal, and a NOR circuit configured to output the second signal obtained by a NOR calculation of the fourth signal and the third signal.

5. The device of claim 2, wherein the sixth node is located between a resistance electrically connected to the first line and a capacitor electrically connected to the second line.

6. The device of claim 1, wherein the arithmetic circuit comprises a NOT circuit configured to output the second signal obtained by a NOT calculation of the first signal.

7. The device of claim 1, wherein the first and second transistors provide an inverter.

8. The device of claim 1, wherein the third and fourth transistors provide an inverter.

9. The device of claim 1, wherein the fifth transistor is electrically connected to the second node through the resistance.

10. The device of claim 1, wherein the sixth transistor is configured to receive the second signal at a gate of the sixth transistor.

11. The device of claim 1, wherein the protection circuit further comprises a high-pass filter provided between the first and second lines and electrically connected to the second node.

12. The device of claim 11, wherein the high-pass filter is provided between the first and second lines downstream of the first, second, third, fourth and fifth transistors.

13. The device of claim 11, wherein the high-pass filter comprises a capacitor and a resistance that are connected in series to each other between the first and second lines.

14. The device of claim 1, wherein the protection circuit further comprises:
  seventh and eighth transistors including gates electrically connected to the second node, and connected in series to each other between the first and second lines; and
  ninth and tenth transistors electrically connected to the fourth node between the seventh and eighth transistors, and connected in series to each other between the first and second lines, and
  the sixth transistor is electrically connected to the fifth node between the ninth and tenth transistors.

15. The device of claim 14, wherein the protection circuit further comprises a low-pass filter electrically connected to the fourth node.

16. The device of claim 15, wherein the low-pass filter comprises a resistance electrically connected to the fourth node, and a capacitor provided between the resistance and the second line.

17. The device of claim 1, wherein the protection circuit further comprises an eleventh transistor including a gate electrically connected to the fifth node and provided between the first and second lines.

18. The device of claim 1, wherein the protection circuit is an electrostatic discharge (ESD) protection circuit that protects the protection target circuit from static electricity.

19. A protection circuit electrically connected to a first line to be supplied with a first voltage and a second line to be supplied with a second voltage, and configured to protect a protection target circuit electrically connected to the first line and the second line downstream of the protection circuit, the protection circuit comprising:
  first and second transistors including gates electrically connected to a first node between the first and second lines, and connected in series to each other between the first and second lines;
  third and fourth transistors including gates electrically connected to a second node between the first and second transistors, and connected in series to each other between the first and second lines;
  a fifth transistor including a gate electrically connected to a third node between the third and fourth transistors, and provided between the second node and the second line;
  an arithmetic circuit configured to receive a first signal from the second node or a fourth node that is provided between the first and second lines and located downstream of the second node, and output a second signal obtained by calculation using the first signal; and
  a sixth transistor electrically connected to a fifth node provided between the first and second lines and located downstream of the second node, and configured to receive the second signal from the arithmetic circuit and output a control signal to the arithmetic circuit.

20. The circuit of claim 19, wherein the protection circuit and the protection target circuit are provided in a same semiconductor device.

* * * * *